US007602234B2

(12) United States Patent
Wong et al.

(10) Patent No.: US 7,602,234 B2
(45) Date of Patent: Oct. 13, 2009

(54) SUBSTANTIALLY ZERO TEMPERATURE COEFFICIENT BIAS GENERATOR

(75) Inventors: Thomas Y. Wong, Markham (CA); Mikhail Rodionov, Markham (CA)

(73) Assignee: ATI Technologies ULC (CA)

( * ) Notice: Subject to any disclaimer, the term of this patent is extended or adjusted under 35 U.S.C. 154(b) by 112 days.

(21) Appl. No.: 11/782,478

(22) Filed: Jul. 24, 2007

(65) Prior Publication Data

US 2009/0027106 A1 Jan. 29, 2009

(51) Int. Cl.
*G05F 1/10* (2006.01)

(52) U.S. Cl. ...................................... 327/538; 327/513

(58) Field of Classification Search ................. 323/313, 323/314, 315; 327/512, 513, 538, 539, 543
See application file for complete search history.

(56) References Cited

U.S. PATENT DOCUMENTS 5,038,053 A * 8/1991 Djenguerian et al. ........ 327/513
5,563,502 A * 10/1996 Akioka et al. ............... 323/313
5,686,825 A * 11/1997 Suh et al. .................... 323/316
5,783,936 A * 7/1998 Girard et al. ................ 323/315
5,880,625 A * 3/1999 Park et al. ................... 327/543
5,982,227 A * 11/1999 Kim et al. ................... 327/543
6,459,326 B2 10/2002 Descombes
6,528,978 B2 * 3/2003 Lim ........................... 323/313
6,529,066 B1 3/2003 Guenot et al.
6,563,295 B2 * 5/2003 Juang ......................... 323/315
6,783,274 B2 * 8/2004 Umeyama et al. ........... 374/178
6,911,861 B2 6/2005 Deng
6,914,831 B2 7/2005 Di Iorio
7,038,530 B2 * 5/2006 Chou ......................... 327/543
7,039,384 B2 5/2006 Pan
7,463,093 B2 * 12/2008 Taylor et al. ................ 330/254

* cited by examiner

*Primary Examiner*—Jeffrey S Zweizig
(74) *Attorney, Agent, or Firm*—Sterne, Kessler, Goldstein & Fox P.L.L.C.

(57) ABSTRACT

In an embodiment, a bias generator circuit comprises a first circuit and a second circuit. The first circuit includes a first input coupled to a voltage source and a first output that provides a first output current having a substantially non-zero temperature coefficient. The first circuit comprises a first transistor and a second transistor. The second circuit includes a second input that receives the first output current from the first circuit and a second output that provides a second output current. The second circuit comprises a third transistor and a fourth transistor. The second output current has a substantially zero temperature coefficient dependent on (i) a difference between an effective channel size of the first transistor and an effective channel size of the second transistor, and (ii) a difference between an effective channel size of the third transistor and an effective channel size of the fourth transistor.

19 Claims, 13 Drawing Sheets

SUBSTANTIALLY ZERO TEMPERATURE COEFFICIENT BIAS GENERATOR

BACKGROUND OF THE INVENTION

1. Field of the Invention

The present invention is generally directed to bias generator circuits.

2. Background Art

A bias generator is an essential building block for many analog circuits. For example, a bias generator may be used in a phase lock loop (PLL) to provide a bias current to analog sub-circuits included in the PLL, such as a charge-pump and a current controlled oscillator (ICO). A conventional complementary metal-oxide semiconductor (CMOS) bias generator provides a temperature dependent output current. Such an output current has a positive temperature coefficient, in which case the output current increases with increased operating temperature. In particular, for PLL circuits implemented in deep sub-micron 0.13 microns, 0.11 microns, 90 nanometers and 80 nanometers CMOS technologies, the output current may vary by as much as 50% over operating temperatures ranging from −10 degree C. to 125 degree C.

Large changes in the output current of a bias generator can have deleterious effects on circuit functionality. For example, variation in bias current causes the characteristics of the charge-pump to change. Variation in bias current also causes the oscillation frequency of the ICO to vary from its design target, thereby affecting the ICO gain and ICO range. As a consequence, PLL stability and jitter performance are affected. Thus, temperature dependent bias generators are problematic.

One possible solution for reducing the temperature dependences of a PLL is to use a bias generator that provides a temperature invariant bias voltage, rather than a temperature invariant bias current. The bias voltage can be converted to a bias current and then the bias current can be provided to the analog sub-circuits of the PLL, such as the ICO.

However, converting a temperature invariant bias voltage to a bias current requires additional circuitry, such as a voltage-to-current (V-to-I) converter. Such V-to-I converters often introduce some degree of temperature dependencies at the output due to the temperature dependency of the additional circuit components. To overcome this problem, off-chip components are sometimes used for very accurate V-to-I conversion. The off-chip components take up board space and increase cost, and are therefore undesirable in terms of integrated PLL designs.

Given the foregoing, what is needed is a zero temperature coefficient current bias generator, and applications thereof. Such a bias generator is desirably implemented in CMOS technology to reduce power consumption.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
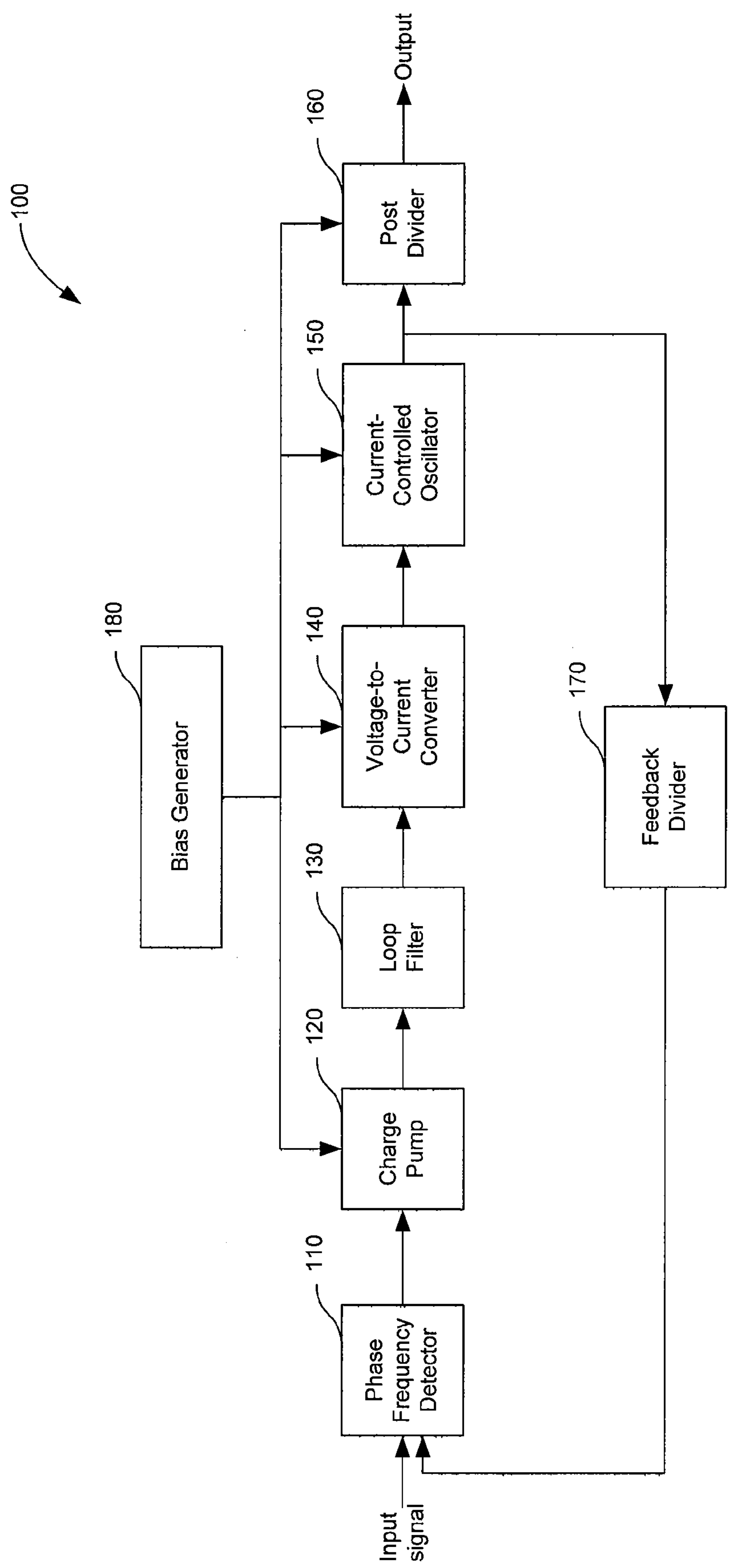
FIG. 1 depicts a block diagram of an example phase locked loop in which a bias generator is implemented in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

I. Overview

The present invention provides a zero temperature coefficient bias generator, and applications thereof. In an embodiment, the bias generator is implemented using CMOS technology. In the description contained herein, reference to “one embodiment”, “an embodiment”, “an example embodiment”, etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A bias generator in accordance with an embodiment of the present invention includes a first circuit and a second circuit. The first circuit includes a first input coupled to a voltage source and a first output that provides a first output current having a substantially non-zero temperature coefficient. The first circuit comprises a first transistor and a second transistor.

The second circuit includes a second input that receives the first output current from the first circuit and a second output that provides a second output current. The second circuit comprises a third transistor and a fourth transistor. The second output current has a substantially zero temperature coefficient dependent on (i) a difference between an effective channel size of the first transistor and an effective channel size of the second transistor, and (ii) a difference between an effective channel size of the third transistor and an effective channel size of the fourth transistor.

In an embodiment, the first output current has a positive temperature coefficient, meaning that the first output current increases with increasing temperature. In this embodiment, the output current of the second circuit by itself has a negative temperature coefficient, meaning that it decreases with increasing temperature. By cascading the second circuit with the first circuit, however, the second output current has a substantially zero temperature coefficient, meaning that the second output current is substantially constant with increasing temperature. It is to be appreciated that the present invention is not limited to this embodiment. For example, the first output current could have a negative temperature coefficient, and the second output current by itself could have a positive temperature coefficient, without deviating from the spirit and scope of the present invention.

In a further embodiment, the first and second circuits include first and second resistors, respectively. In this embodiment, the substantially zero temperature coefficient of the second output current is further dependent on the values of the first and second resistors.

A bias generator in accordance with an embodiment of the present invention may be implemented in a system that uses a temperature independent output current. For example, a bias generator 180 in accordance with an embodiment of the present invention may be implemented in an example PLL 100, as illustrated in FIG. 1. Referring to FIG. 1, PLL 100 includes a phase frequency detector 110, a charge pump 120, a loop filter 130, a voltage-to-current (V-to-I) converter 140, an ICO 150, a post divider 160, and a feedback divider 170. As is well-known, a phase locked loop attempts to match the frequency and phase of a feedback signal to the frequency and phase of an input reference signal. The feedback signal of PLL 100 is provided by feedback divider 170. The operation of PLL 100 is described in more detail below.

Phase frequency detector 110 compares the phases of an input reference signal to a feedback signal. If the phase of the feedback signal falls behind that of the input signal, phase frequency detector 110 causes charge pump 120 to change the control voltage to voltage-to-current converter 140, and thereby speed up the oscillation of ICO 150. If, on the other hand, the phase of the feedback signal gets ahead of the input signal, phase frequency detector 110 causes charge pump 120 to change the control voltage to voltage-to-current converter 140, and thereby slow down the oscillation of ICO 150. The abrupt changes in the control voltage are smoothed by loop filter 130. The output of ICO 150 is provided to post divider 160. Post divider 160, in turn, provides the output signal of PLL 100. The output of ICO 150 also provides a signal to feedback divider 170 and then is provided as a feedback signal to phase frequency detector 110.

Bias generator 180 provides a temperature independent reference current to charge pump 120, V-to-I converter 140, ICO 150, and post divider 160. In this way, bias generator 180 reduces the problem of temperature sensitive biasing associated with conventional PLL circuits.

As mentioned above, a bias generator in accordance with the present invention (such as bias generator 180) comprises a first circuit (having an output current with a substantially positive temperature coefficient) and a second circuit (having output current with a substantially negative temperature coefficient). By cascading these two circuits together, such a bias generator provides a temperature independent output current. An example first circuit, an example second circuit, and an example manner for cascading the example first and the example second circuit are described in more detail below.

II. An Example First Circuit that Provides an Output Current Having a Positive Temperature Coefficient As mentioned above, a bias generator in accordance with the present invention includes a first circuit that provides an output current having a non-zero temperature coefficient (such as a positive temperature coefficient). This section presents structure, characteristics, and some exemplary potential modifications to an example first circuit in accordance with the present invention.

A. Structure

Figure 2:
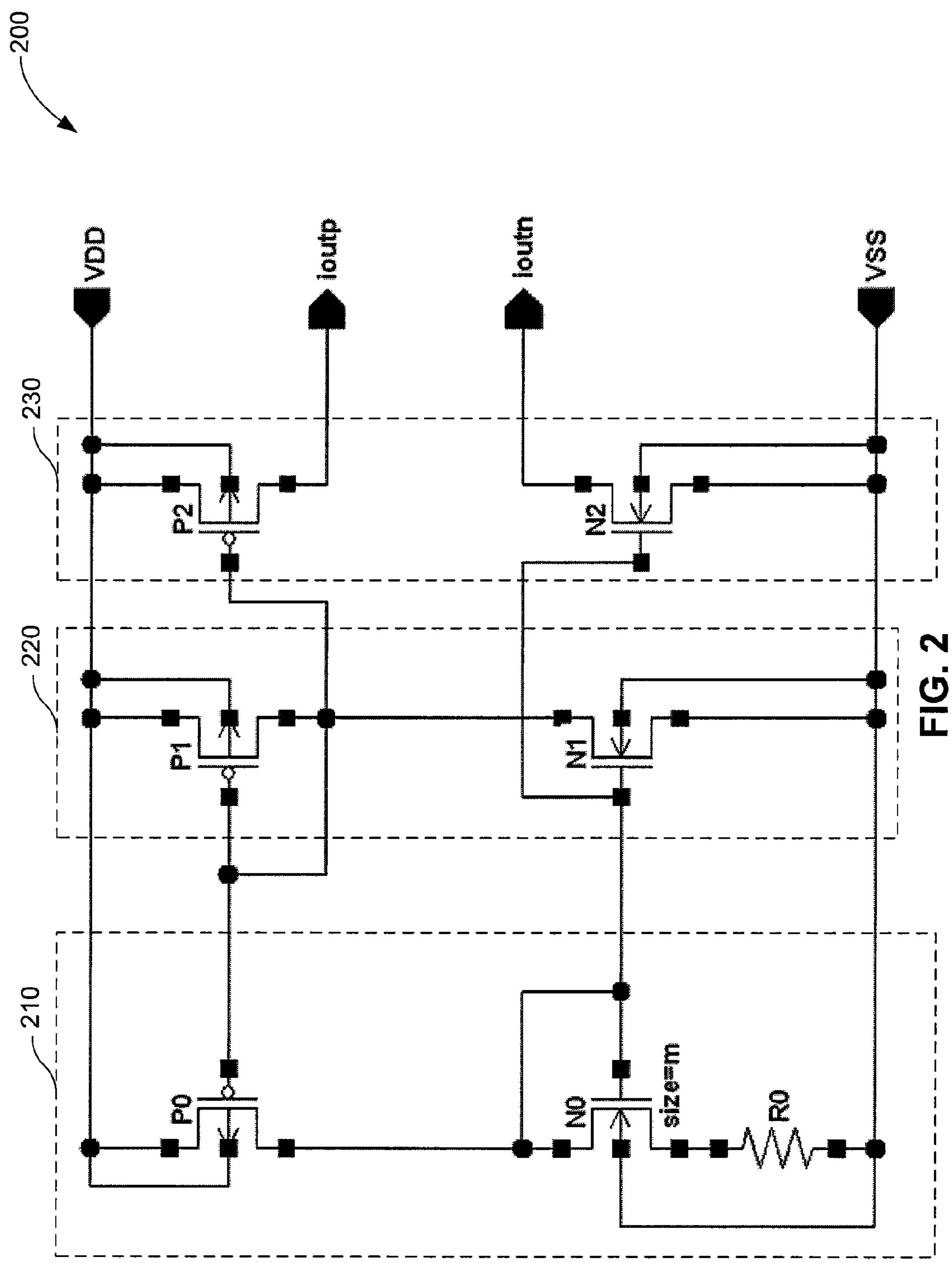
FIG. 2 depicts a schematic circuit diagram of a conventional bias generator circuit having an output current with a positive temperature coefficient.

FIG. 2 is a circuit diagram illustrating an example structure of a first circuit 200 that is included in bias generator 180 in accordance with an embodiment of the present invention. In the embodiment illustrated in FIG. 2, first circuit 200 has a positive temperature coefficient, meaning that the output current of first circuit 200 increases with increasing temperature. As mentioned above, the present invention is not limited by this embodiment. First circuit 200 can have a negative temperature coefficient without deviating from the spirit and scope of the present invention. Referring to FIG. 2, first circuit 200 comprises three CMOS current branches: (i) a first current branch 210; (ii) a second current branch 220; and (iii) a third current branch 230. As described in more detail below, first current branch 210, second current branch 220, and third current branch 230 carry equal current.

First current branch 210 includes a first p-type metal-oxide-semiconductor field-effect transistor (MOSFET) P0, a first n-type MOSFET N0, and a resistor R0. The source of P0 is coupled to a high voltage source VDD. The drain of P0 is coupled to the drain and gate of N0. The source of N0 is, in turn, coupled to a first end of resistor R0. A second end of resistor R0 is coupled to a low voltage source VSS. First current branch 210 is coupled to second current branch 220 via the gates of P0 and N0.

Second current branch 220 includes a second p-type MOSFET P1 and a second n-type MOSFET N1. The source of P1 is coupled to high voltage source VDD. The drain of P1 is coupled to the gate of P1 and the drain of N1. The source of N1 is, in turn, coupled to low voltage source VSS. The gates of P1 and N1 are respectively coupled to the gates of P0 and N0. The gates of P1 and N1 also provide the coupling between second current branch 220 and third current branch 230.

Third current branch 230 includes a third p-type MOSFET P2 and a third n-type MOSFET N2. The source of P2 is coupled to high voltage source VDD. The drain of P2 and the drain of N2 provide the output currents ioutp and ioutn, respectively. The source of N2 is coupled to low voltage source VSS. The gates of P2 and N2 are respectively coupled to the gates of P1 and N1.

Importantly, the following conditions hold.

(i) The effective channel size of P0, P1, and P2 are substantially identical. These transistors comprise a current mirror which effects equal current to flow through first current branch 210, second current branch 220, and output current ioutp.

(ii) The effective channel size of N0 (depicted as size=m in FIG. 2) is different than the effective channel size of N1. The effective channel size of N0 and N1 can be changed by changing the width or length of the conduction channel of N0 and N1, or by changing the number of transistors that comprise N0 and N1.

(iii) The effective channel size of N1 is substantially identical to the effective channel size of N2. N1 and N2 form a current mirror which forces equal current to flow through second current branch 220 and output current ioutn.

As described in more detail below, the output current of first circuit 200 depends on, for example, the difference in effective channel size between N0 and N1, and the value of the resistance of R0.

B. Characteristics

First circuit 200 provides a positive output current, ioutp, at the drain terminal of P2, and provides a negative output current, ioutn, at the drain terminal of N2. The characteristics of ioutp and ioutn are substantially identical, except the current (e.g., charge carriers) flow in opposite directions for ioutp and ioutn. For illustrative purposes, the characteristics of these output currents are described herein in terms of the positive output current, ioutp, only.

As mentioned above, the magnitude of ioutp depends on the difference in effective channel size between N0 and N1, and also on the value of the resistance of resistor R0. As mentioned above, ioutp has a positive temperature coefficient. These facts are reflected in the following general equation (which is valid when the same current flows through the channels of N0 and N1):

$$\frac{\delta ioutp(T)}{\delta T} = -\alpha \cdot \frac{\delta\mu(T)}{\delta T}; \text{ wherein } \frac{\delta ioutp(T)}{\delta T} \tag{1}$$

represents the variation of ioutp with respect to temperature T; μ(T) represents the mobility of the major carrier (e.g., electrons) in the MOSFET channel region of N0 and N1;

$$\frac{\delta\mu(T)}{\delta T}$$

represents the variation of μ(T) with respect to temperature T; and α represents a parameter that depends on (i) the difference in the effective channel size between N0 and N1 and (ii) the resistance value of R0.

Because the quantity $$\frac{\delta\mu(T)}{\delta T}$$

is negative and the parameter α is positive, the variation of the output current with respect to temperature $$\frac{\delta iout(T)}{\delta T}$$

is positive.

Figure 3:
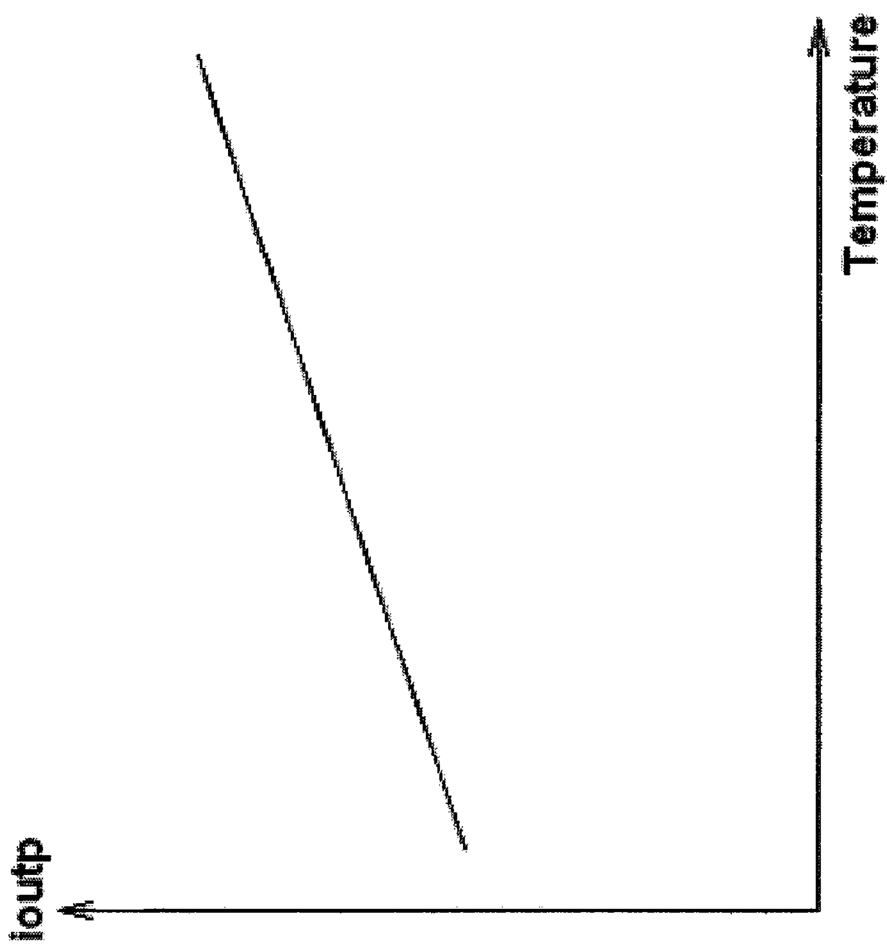
FIG. 3 depicts a graph illustrating the output current of the circuit of FIG. 2 as a function of temperature.

FIG. 3 graphically illustrates the variation of the output current ioutp as a function of temperature T. The slope of the graph in FIG. 3 is equal to the parameter α.

With respect to first circuit 200 depicted in FIG. 2, equation (1) can be recast in the following manner to illustrate the explicit form of the parameter α:

$$\frac{\delta ioutp(T)}{\delta T} = -\frac{2((L_{N1}/W_{N1})^{0.5} - (L_{N0}/W_{N0})^{0.5})^2}{\mu^2 R^2 C_{ox}} \cdot \frac{\delta\mu(T)}{\delta T}; \tag{2}$$

wherein, $W_{N0}$ and $W_{N1}$ represent the effective channel width of N0 and N1, respectively; $L_{N0}$ and $L_{N1}$ represent the effective channel length of N0 and N1; $C_{ox}$ represents a gate oxide capacitance per unit area of the MOSFET; R represents the resistance value of R0; T represents temperature; and μ represents the mobility of the major carrier (e.g., electrons in an n-type MOSFET channel region).

The value of the effective channel size (e.g., $W_{N0}$, $W_{N1}$, $L_{N0}$, $L_{N1}$, and/or the relative number of transistor comprising N0 and N1) and/or the value of the resistance of R0 are parameters that can be adjusted by varying dimension of features printed on an integrated circuit during the fabrication process. The value of the mobility μ can be adjusted by varying the doping of the semiconductor material used during the fabrication process. As described in more detail below, these parameters are adjusted in accordance with the present invention to effect the value of the parameter α in equation (1).

C. Some Exemplary Potential Modifications

First circuit 200 can be varied in several exemplary ways in accordance with the present invention. For example, Cascode transistors can be added to first circuit 200 (see, e.g., FIG. 4) to improve the output impedance, and/or a start-up and a shut-down circuit can be added to first circuit 200 (see, e.g., FIG. 5) to effectuate proper start-up and shut-down. Each of these example modifications is described in more detail below.

Figure 4:
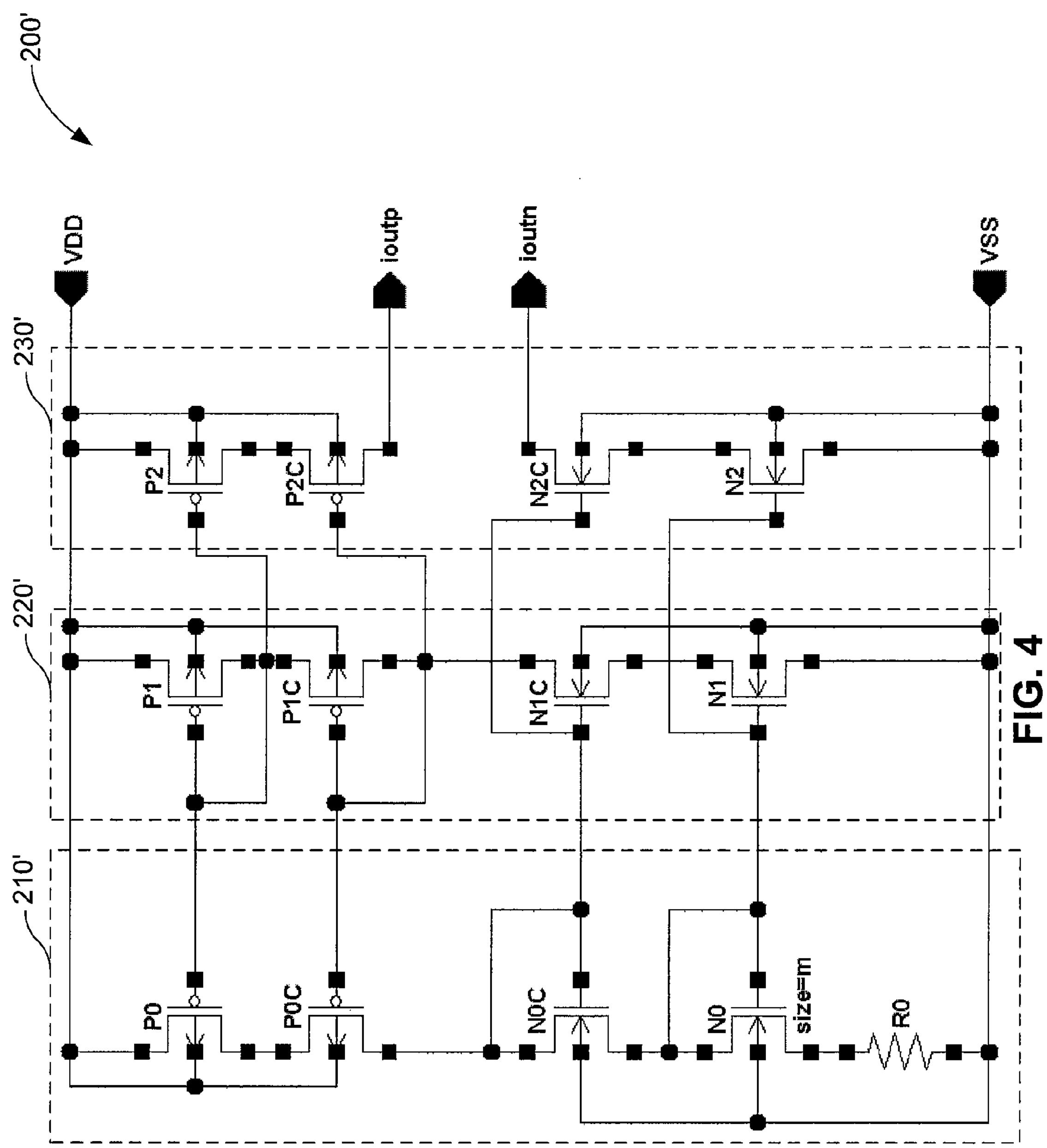
FIG. 4 depicts a schematic circuit diagram of the circuit of FIG. 2 with the addition of cascode transistors.

FIG. 4 illustrates an embodiment of first circuit 200' in which Cascode transistors are included to increase the output impedance, and thereby improve the power supply rejection (especially at low frequencies). Cascode transistors are well-known in the art and therefore their operation will not be described herein. Similar to first circuit 200 depicted in FIG. 2, first circuit 200' depicted in FIG. 4 includes three CMOS current branches: (i) a first current branch 210'; (ii) a second current branch 220'; and (iii) a third current branch 230'. First current branch 210', second current branch 220', and third current branch 230' carry equal current.

In addition to the elements included in first current branch 210 described above with reference to FIG. 2, first current branch 210' of FIG. 4 includes a first p-type Cascode MOSFET P0C and a first n-type Cascode MOSFET N0C. With reference to FIG. 4, the source of P0C is coupled to the drain of P0, and the drain of P0C is coupled to the drain and gate of N0C. The source of N0C is, in turn, coupled to the drain and gate of N0. In addition to the gates of P0 and N0, the gates of P0C and N0C provide an additional coupling between first current branch 210' and second current branch 220'.

In addition to the elements included in second current branch 220 described above with reference to FIG. 2, second current branch 220' of FIG. 4 includes a second p-type Cascode MOSFET P1C and a second n-type Cascode MOSFET N1C. With reference to FIG. 4, the source of P1C is coupled to the drain and gate of P1, and the drain of P1C is coupled to gate of P1C and the drain of N1C. The source of N1C is, in turn, coupled to the drain of N1. The gates of P1C and N1C are respectively coupled to the gates of P0C and N0C. The gates of P1C and N1C also provide a coupling between second current branch 220' and third current branch 230'.

In addition to the elements included in third current branch 230 described above with reference to FIG. 2, third current branch 230' of FIG. 4 includes a third p-type Cascode MOSFET P2C and a third n-type Cascode MOSFET N2C. With reference to FIG. 4, the source of P2C is coupled to the drain of P2, and the drain of P2C and the drain of N2C provide the output currents ioutp and ioutn, respectively. The source of N2C is, in turn, coupled to the drain of N2. The gates of P2C and N2C are respectively coupled to the gates of P1C and N1C.

Figure 5:
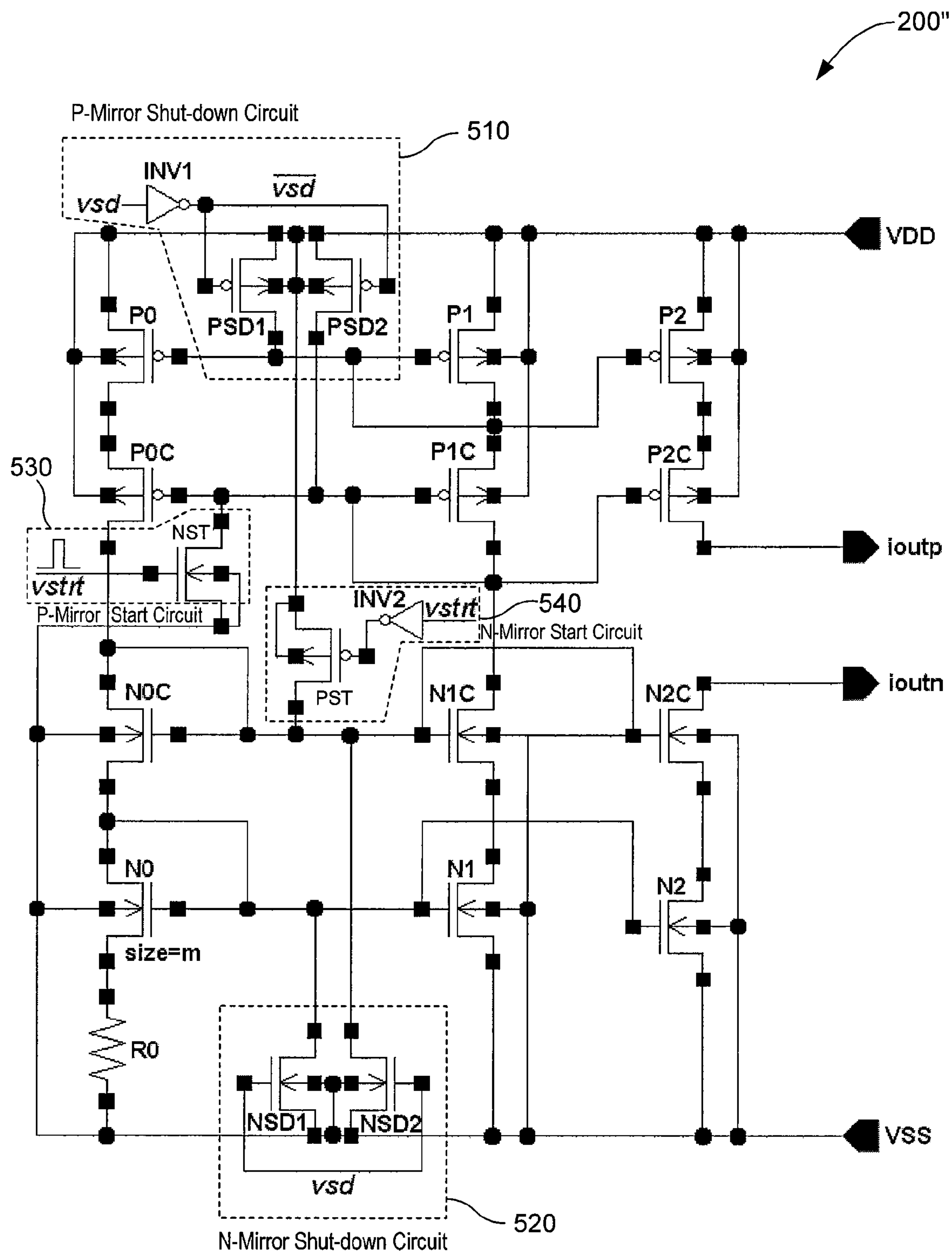
FIG. 5 depicts a schematic circuit diagram of the circuit of FIG. 4 with the addition of start-up circuits and shut-down circuits.

FIG. 5 illustrates an embodiment of first circuit 200" in which start-up and shut-down circuits are included. In addition to the elements depicted in first circuit 200' of FIG. 4, first circuit 200" of FIG. 5 includes a p-mirror start circuit 530, an n-mirror start circuit 540, a p-mirror shut-down 510, and an n-mirror shut-down circuit 520.

P-mirror start circuit 530 includes an n-mirror start-up MOSFET NST. N-mirror start circuit 540 includes an inverter INV 2 and a p-mirror start-up MOSFET PST. At start up, a start-up pulse VSTRT is applied to the gate of NST and the input of INV 2. With respect to the p-mirror start circuit 530, the start-up pulse causes NST to temporarily turn on. As a result, the gates of P0C, P1C, and P2C are pulled to the low voltage VSS, thereby turning these p-mirror transistors on. With respect to the n-mirror start circuit 540, the start-up pulse is inverted by INV 2 and then applied to the gate of PST, thereby temporarily turning this transistor on. As a result, the gates of N0C, N1C, and N2C are all pulled to the high voltage VDD, thereby turning these n-mirror transistors on. Turning on transistors P0C, P1C, P2C, N0C, N1C, and N2C in this manner gives first circuit 200" a sufficient "kick" to cause it to begin to operate in the desired manner.

P-mirror shut-down circuit 510 includes an inverter INV1 and a transistor PSD1 and a transistor PSD2. N-mirror shut-down circuit 520 includes a first shut-down MOSFET NSD1 and a second shut-down MOSFET NSD2. To shut-down first circuit 200", a shut-down signal VSD is applied to the input of inverter INV1 and to the gates of NSD1 and NSD2. With respect to p-mirror shut-down circuit 510, inverter INV1 inverts the shut-down signal VSD resulting in an inverted signal $\overline{\mathrm{VSD}}$. By applying $\overline{\mathrm{VSD}}$ to the gates of PSD1 and PSD 2, these transistor turn on. As a result of PSD1 turning on, the gates of P0, P1, and P2 are pulled to the high voltage VDD, thereby shutting transistors P0, P1, and P2 off. Similarly, as a result of PSD2 turning on, the gates of P0C, P1C, and P2C are pulled to the high voltage VDD, thereby shutting transistors P0C, P1C, and P2C off.

With respect to n-mirror shut-down circuit 520, applying the shut-down signal VSD to the gates of NSD 1 and NSD 2 causes these transistors to turn on. As a result of NSD 1 turning on, the gates of N0, N1, and N2 are pulled to the low voltage VSS, thereby turning N0, N1, and N2 off. Similarly, as a result of NSD 2 turning on, the gates of N0C, N1C, and N2C are pulled to the low voltage VSS, thereby turning N0C, N1C, and N2C off.

It is to be appreciated that first circuits 200, 200', and 200" are shown for illustrative purposes only. Other similar types of circuits that provide an output current with a non-zero temperature coefficient may be used without deviating from the spirit and scope of the present invention.

III. An Example Second Circuit that Provides an Output Current Having a Negative Temperature Coefficient A bias generator in accordance with an embodiment of the present invention further comprises a second circuit that provides an output current having a non-zero temperature coefficient (such as a negative temperature coefficient). This section presents structure, characteristics, and some exemplary potential modifications to an example second circuit in accordance with an embodiment of the present invention.

A. Structure

Figure 6:
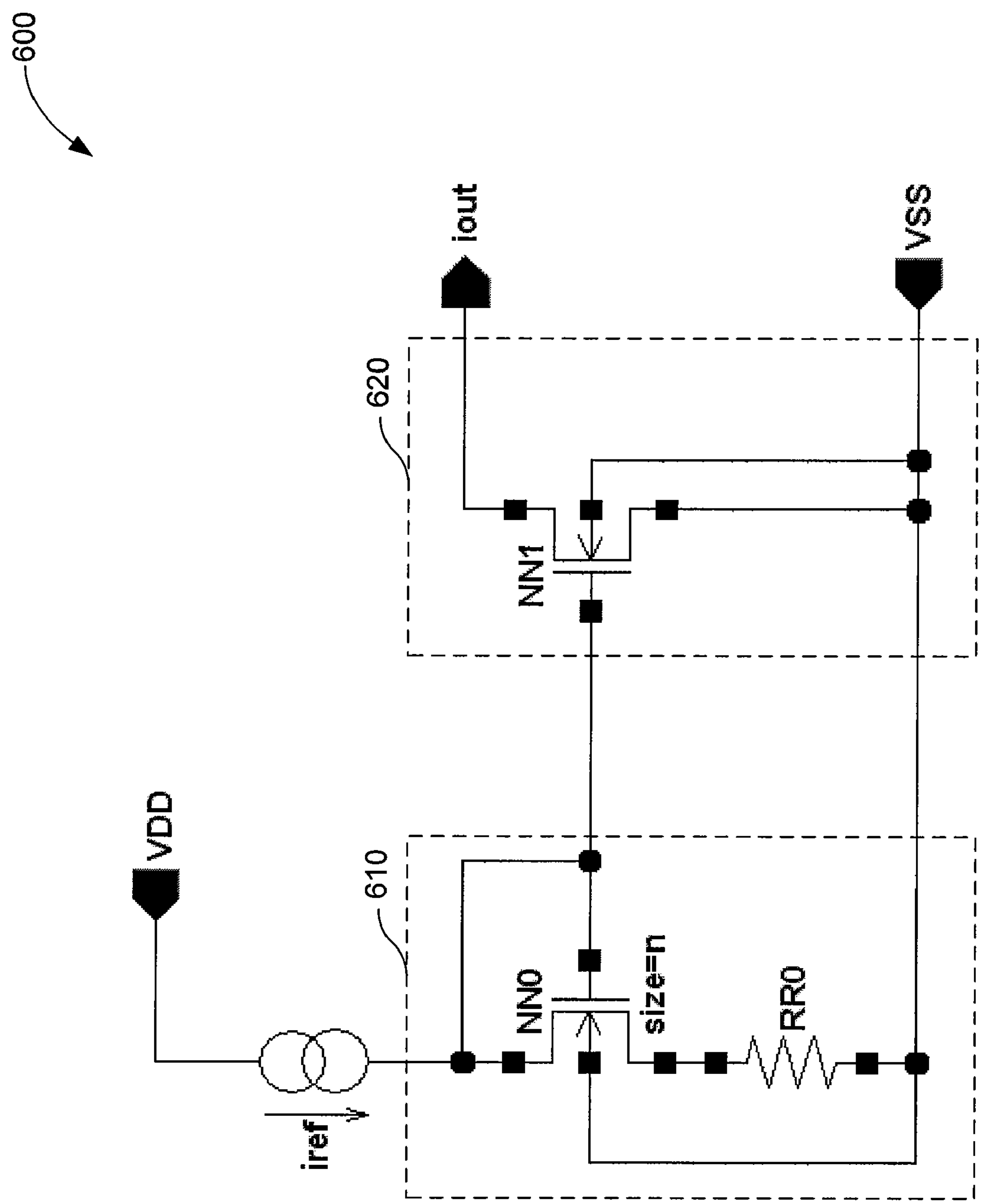
FIG. 6 depicts a schematic circuit diagram a negative temperature coefficient circuit.

FIG. 6 depicts a circuit diagram illustrating an example structure of a second circuit 600 that is included in a bias generator in accordance with an embodiment of the present invention. Referring to FIG. 6, second circuit 600 comprises two CMOS current branches: (i) a fourth current branch 610; and (ii) a fifth current branch 620. (The numbering of these current branches—i.e., "fourth" and "fifth"—corresponds with the numbering of the three CMOS current branches included in first circuits 200, 200', and 200".) As described in more detail below, fifth current branch 620 acts as a current mirror to fourth current branch 610.

Fourth current branch 610 includes an n-type MOSFET NN0 and a resistor RR0. Referring to FIG. 6, the drain of NN0 is coupled to the gate of NN0 and to an input reference current iref. As illustrated in FIG. 6, input reference current iref is a fixed direct current (DC) reference current. As described in more detail below (see, e.g., FIG. 9), the input reference current is not fixed, but rather comprises the output current of first circuit 200". The source of NN0 is coupled to a first end of resistor RR0. A second end of resistor RR0 is coupled to a low voltage source VSS. Fourth current branch 610 is coupled to fifth current branch 620 via the gate NN0. Fifth current branch 620 includes an n-type MOSFET NN1. The gate of NN1 is coupled to the gate and drain of NN0, and the source of NN1 is coupled to the low voltage source VSS. The output current of second circuit 600 is provided at the source of NN1, as described in more detail below.

Importantly, the effective channel size (e.g., effective channel width and length) of NN0 (depicted as size=n in FIG. 6) is different than the effective channel size of NN1. The effective channel size of NN0 and NN1 can be established using well-known fabricated techniques. As described in more detail below, the output current of second circuit 600 depends on, for example, the difference in effective channel size between NN0 and NN1, and the value of the resistance of RR0.

B. Characteristics

Second circuit 600 provides an output current, iout, at the source terminal of NN1. As mentioned above, the magnitude of iout depends on the difference in effective channel size between NN0 and NN1, and also on the value of the resistance of resistor RR0. Also mentioned above, is the fact that iout has a negative temperature coefficient. These facts are reflected in the following general equation:

$$\frac{\delta iout(T)}{\delta T} = \beta \cdot \frac{\delta \mu(t)}{\delta T}; \text{ wherein } \frac{\delta ioutp(T)}{\delta T} \quad (3)$$

represents the variation of iout with respect to temperature T; μ(T) represents the mobility of the major carrier (e.g., electrons) in an n-type MOSFET channel region;

$$\frac{\delta \mu(T)}{\delta T}$$

represents the variation of μ(T) with respect to temperature T; and β represents a parameter that depends on (i) the difference in the effective channel size between NN0 and NN1 and (ii) the resistance value of RR0.

Figure 7:
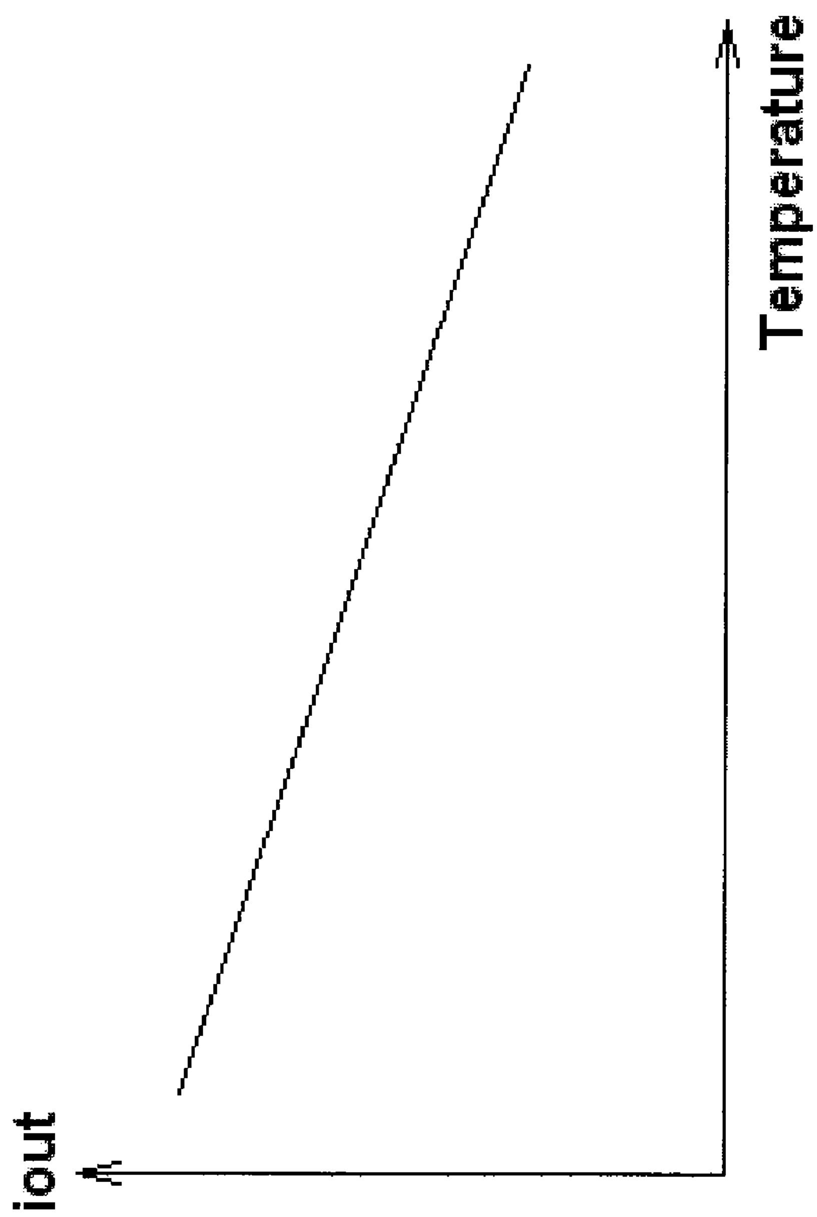
FIG. 7 depicts a graph illustrating the output current of the circuit of FIG. 6 as a function of temperature.

Because the quantity $$\frac{\delta \mu(T)}{\delta T}$$

is negative and the parameter β is positive, the variation of the output current of second circuit 600 with respect to temperature $$\frac{\delta iout(T)}{\delta T}$$

is negative. FIG. 7 graphically illustrates the variation of the output current iout as a function of temperature T. The slope of the graph in FIG. 7 is equal to the value of parameter β.

With respect to second circuit 600 depicted in FIG. 6, equation (3) can be recast in equation (4) in the following form to illustrate the explicit form of the parameter β:

$$\frac{\delta iout(T)}{\delta T} = \left[\frac{\frac{W_{NN1}}{L_{NN1}}\cdot\left(\frac{L_{NN0}}{W_{NN0}}\right)^{1/2}\cdot\left(\frac{C_{0X}}{2\mu}\right)^{1/2}\cdot}{iref^{1.5}\cdot RR0+\frac{C_{0X}W_{NN1}}{2L_{NN1}}\cdot iref^{2}\cdot RR0^{2}}\right]\cdot\frac{\delta\mu(t)}{\delta T} \tag{4}$$

wherein, $W_{NN0}$ and $W_{NN1}$ represent the effective channel width of NN0 and NN1, respectively; $L_{NN0}$ and $L_{NN1}$ represent the effective channel length of NN0 and NN1, respectively; $C_{ox}$ represents a gate oxide capacitance per unit area of the MOSFET; iref represents the reference current provided at the drain of NN0; RR0 represents the resistance of resistor RR0; T is temperature; and μ represents the mobility of the major carrier (e.g., electrons in an n-type MOSFET channel region).

The value of the effective channel size (e.g., $W_{NN0}$, $W_{NN1}$, $L_{NN0}$ and $L_{NN1}$) and/or the value of the resistance of RR0 are parameters that can be adjusted by varying dimension of features printed on an integrated circuit during the fabrication process. As mentioned above, the value of the mobility μ can be adjusted by varying the doping of the semiconductor material used during the fabrication process. As described in more detail below, these parameters are adjusted in accordance with an embodiment of the present invention to effect the value of the parameter β in equation (3).

C. Some Exemplary Potential Modifications

Figure 8A:
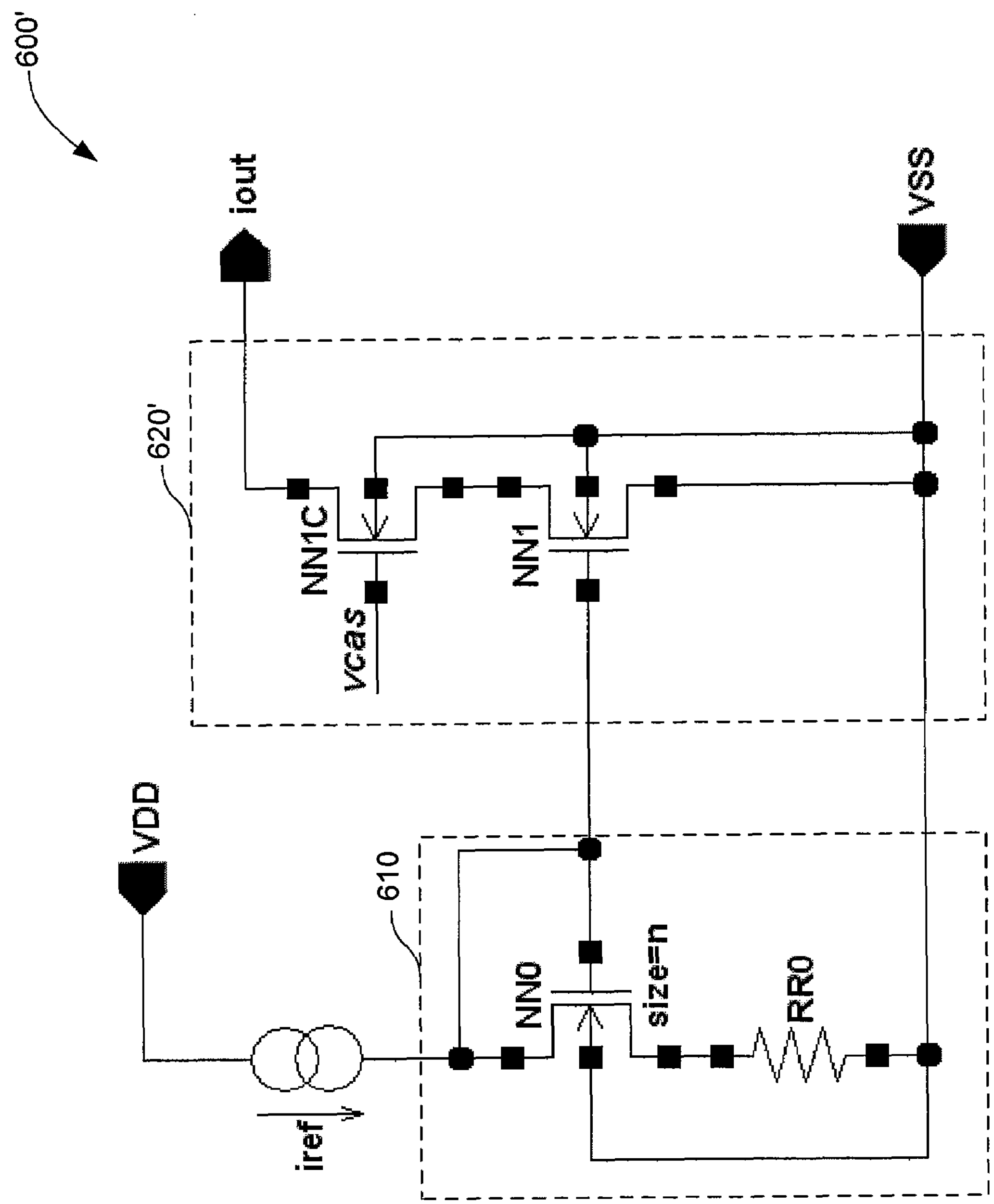
FIG. 8A depicts the circuit of FIG. 6 with the addition of a cascode transistor.

Second circuit 600 can be varied in several exemplary ways in accordance with the present invention. For example, Cascode transistors can be included as illustrated in circuit 600' of FIG. 8A. As mentioned above, the inclusion of Cascode transistors improves the output impedance, and thereby minimizes output variation. Referring to FIG. 8A, circuit 600' includes a cascade transistor NN1C. The source of NN1C is coupled to the drain of NN1. In this embodiment, the output current is provided at the drain of NN1C. A cascade voltage vcas is applied to the gate of NN1C to increase the output impedance of NN1, as is well-known in the relevant art(s).

Figure 8B:
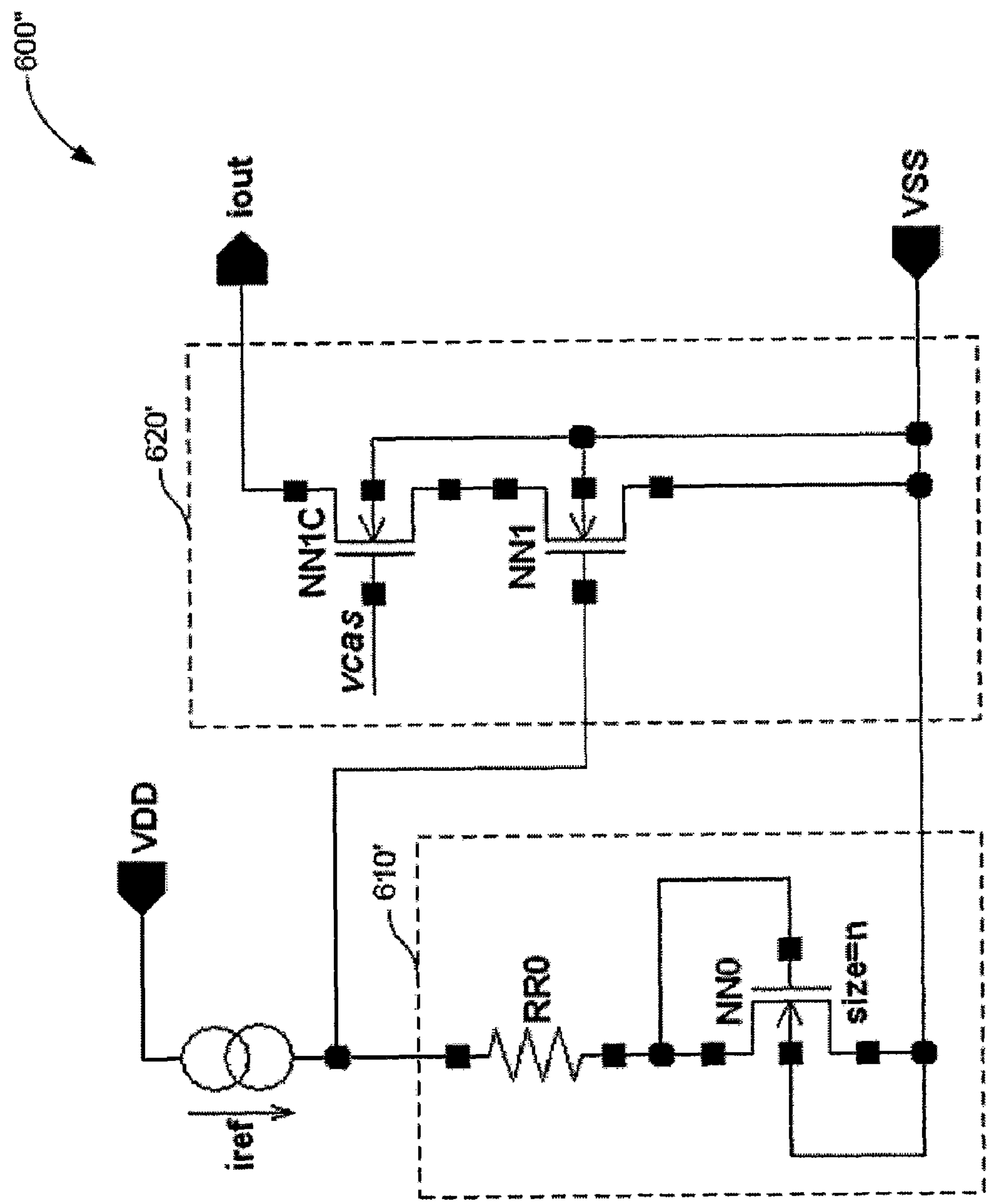
FIG. 8B depicts an alternative configuration of the circuit depicted in FIG. 8A.

Second circuit 600 can be varied in another alternative way as illustrated by circuit 600" depicted in FIG. 8B. In circuit 600", a first end of resistor RR0 is coupled to an input reference current iref. The second end of resistor RR0 is connected to the drain of NN0 and to the gate of NN0. The source of NN0 is coupled to a low voltage source VSS. Fourth current branch 610' is coupled to fifth current branch 620' via the first end of resistor RR0.

It is to be appreciated that circuits 600, 600', and 600" are shown for illustrative purposes only. Other similar types of circuits that provide an output current with a negative temperature coefficient may be used without deviating from the spirit and scope of the present invention.

IV. Cascading the First Circuit and the Second Circuit to Provide an Output Current Having a Substantially Zero Temperature Coefficient in Accordance with an Embodiment of the Present Invention In an embodiment, one of circuits 200, 200', or 200" (which each provide an output current having a positive temperature coefficient) is combined with one of circuits 600, 600', or 600" (which each provides an output current having a negative temperature coefficient) to form a bias generator that provides a temperature invariant output current. Cascading one of circuits 200, 200', or 200" with one of circuits 600, 600', or 600" yields an output current which has a near zero temperature coefficient (ZTC).

A. Structure

Figure 9:
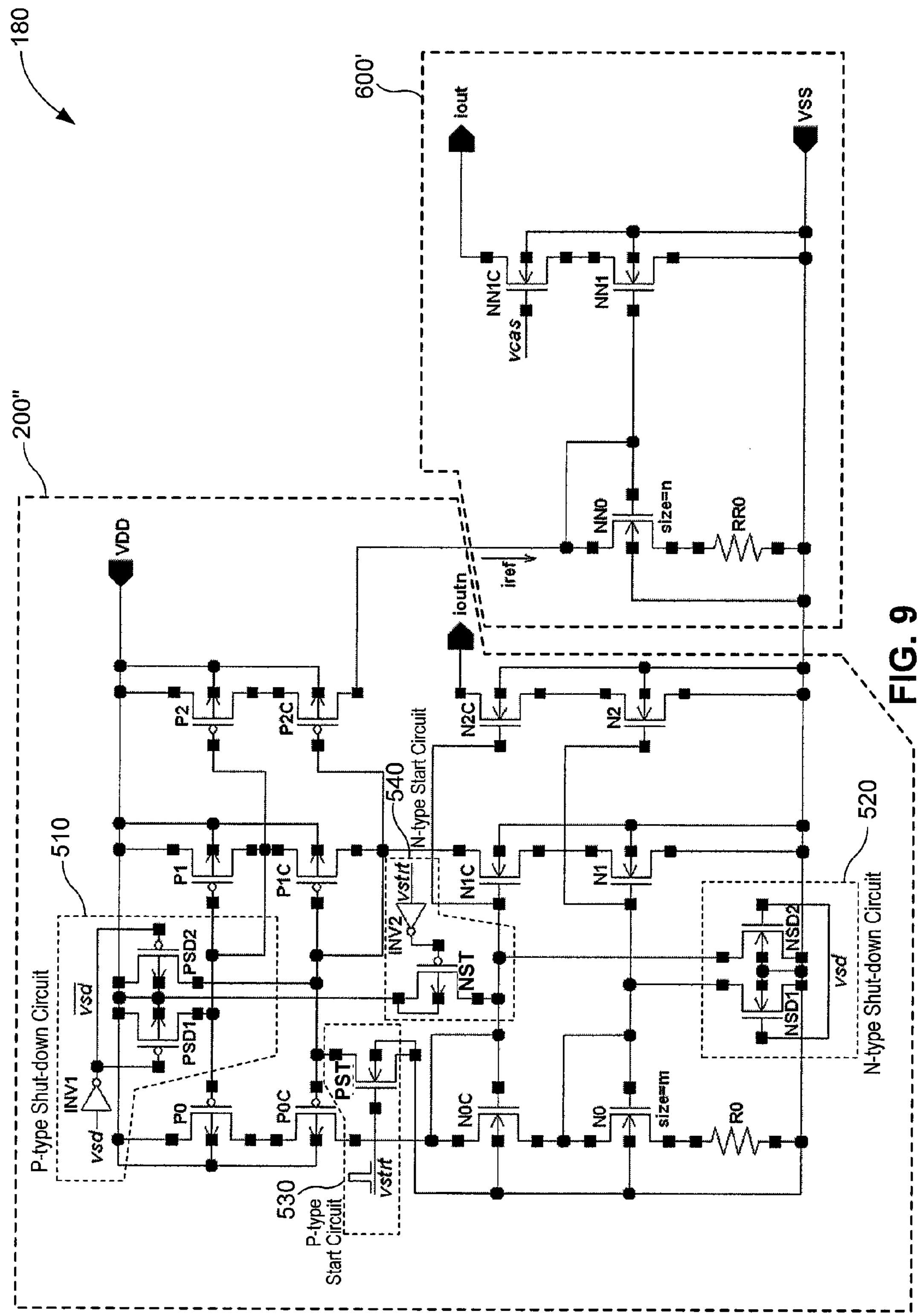
FIG. 9 depicts a schematic circuit diagram illustrating the circuit of FIG. 5 cascaded with the circuit of FIG. 8 resulting in a circuit having an output current with a zero temperature coefficient.

FIG. 9 is a circuit diagram illustrating a temperature invariant bias generator 180 in accordance with an embodiment of the present invention. As illustrated in FIG. 9, bias generator 180 comprises first circuit 200" of FIG. 5 and second circuit 600' of FIG. 8. In bias generator 180, the drain of P2C is coupled to the drain of NN0, such that the output current of first circuit 200" is provided as the input reference iref to second circuit 600'.

B. Characteristics

The characteristics of the output current iout of bias generator 180 are dependent on the output current of first circuit 200" and the output current of second circuit 600'. As set forth above, the output current of first circuit 200" is, in turn, dependent on the following parameters: (i) the difference in effective channel size between N0 and N1 of first circuit 200"; and (ii) the resistance value of resistor R0 of first circuit 200". Similarly, the output current of second circuit 600' is dependent on the following parameters: (iii) the difference in effective channel size between NN0 and NN1 of second circuit 600'; and (iv) the resistance value of resistor RR0 of second circuit 600'. Thus, the output current iout of bias generator 180 is dependent on the value of the parameters identified in items (i)-(iv). These facts are reflected in the following equation:

$$\frac{\delta ioutp(T)}{\delta T} = (-\alpha+\beta)\cdot\frac{\delta\mu(T)}{\delta T} \tag{5}$$

which is obtained by adding Eqs. (1) and (3).

Figure 10:
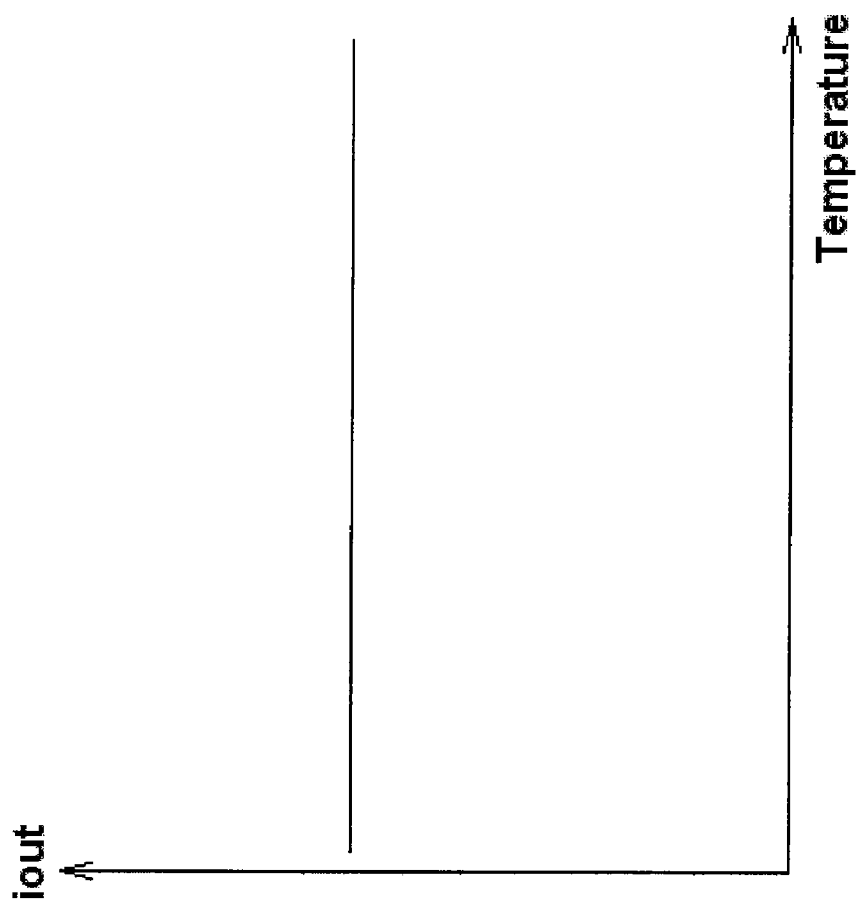
FIG. 10 depicts a graph illustrating the output current of the circuit of FIG. 9 as a function of temperature.

Specific values of the parameters identified in items (i)-(iv) are chosen to cause the output current iout of bias generator 180 to be substantially temperature invariant. In other words, parameters are chosen to cause the output current iout to have a substantially zero temperature coefficient, as illustrated in FIG. 10. The output current iout will have a substantially zero temperature coefficient when the temperature coefficient of first circuit 200" (−α) is substantially the additive inverse of the temperature coefficient of second circuit 600' (β)—i.e., when $$-\alpha+\beta=0 \tag{7}$$

Presented below are example values that may be used in first circuit 200" and second circuit 600' of bias generator 180 to provide an output current that is temperature independent. It is to be appreciated, however, that these values are presented by way of illustration only. Other values may be used without deviating from the spirit and scope of the present invention.

First circuit 200" includes elements having the following specifications:

- P0 and P1 each comprise 20 transistors and each transistor has a conduction channel with a length of 4 microns and a width of 6 microns;
- P2 comprises 10 transistors each having a conduction channel with a length of 4 microns and a width of 6 microns;
- N0 comprises 60 transistors each having a conduction channel with a length of 1.2 microns and a width of 12 microns;
- N1 comprises 30 transistors each having a conduction channel with a length of 1.2 microns and a width of 12 microns; and
- R0 has a resistance of 250 ohms.

In this embodiment, the effective channel size of N0 is twice as big as the effective channel size of N1 because there are twice as many transistors comprising N0 as there are comprising N1.

In this embodiment, second circuit 600' includes elements having the following specifications:

- NN0 comprises 20 transistors each having a conduction channel with a length of 4 microns and a width of 2 microns;
- NN1 comprises 8 transistors each having a conduction channel with a length of 4 microns and a width of 2 microns; and
- RR0 has a resistance of 1.8 kilo-ohms.

In this embodiment, the effective channel size of NN0 is 2.5 times as big as the effective channel size of NN1 because there are 2.5 times as many transistors comprising NN0 as there are comprising NN1.

C. Some Exemplary Possible Modifications

Bias generator 180, and circuits thereof, can be modified in several exemplary ways in accordance with embodiments of the present invention. As an initial matter, various methods can be used to improve the output impedance of a transistor, in addition to the use of cascade transistors (as illustrated in FIGS. 4, 8A, and 8B). For example, source degeneration methods can be used to improve the output impedance, as illustrated in FIGS. 11A and 11B.

Figure 11A:
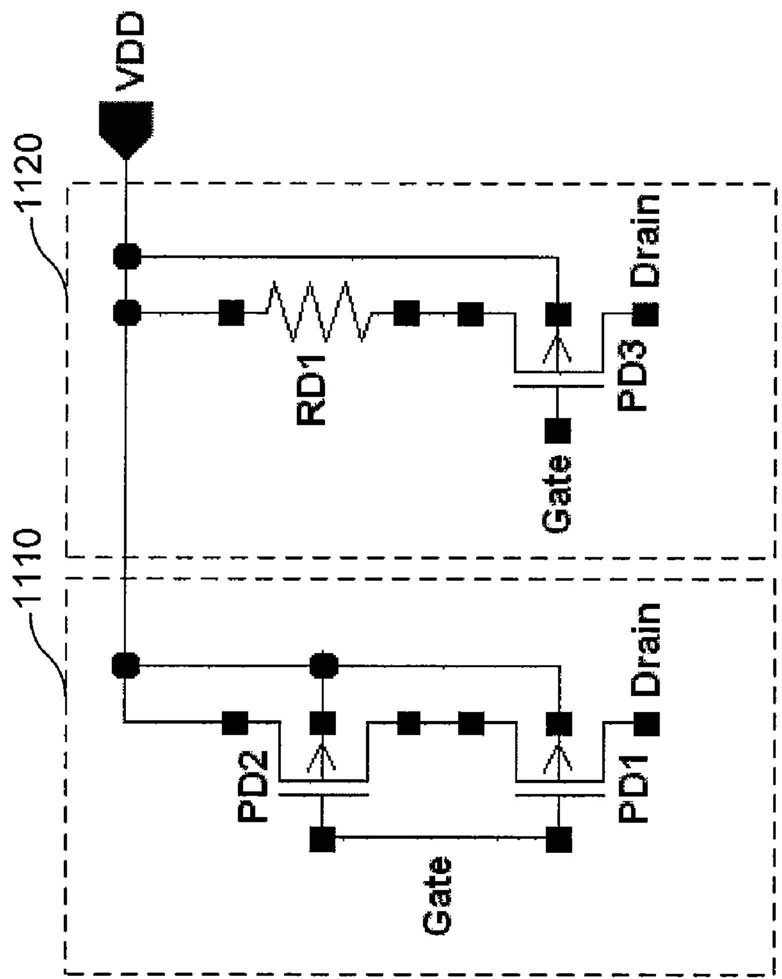
FIGS. 11A and 11B depict alternative circuits that may be used to improve the output impedance of a transistor.

Referring to FIG. 11A, there is illustrated a first source degeneration circuit 1110 and a second source degeneration circuit 1120. First source degeneration circuit 1110 includes a PMOS transistor PD1, with source degeneration achieved by a second PMOS transistor PD2. In first source degeneration circuit 1110, the source of PD2 is coupled to a high voltage source VDD and the drain of PD2 is coupled to the source of PD1. The gates of PD2 and PD1 are coupled together. Second source degeneration circuit 1120 includes a source degenerated PMOS transistor PD3, with source degeneration achieved by a resistor RD1. In second source degeneration circuit 1120, a first end of RD1 is coupled to high voltage source VDD and a second end of RD1 is coupled to the source of PD3.

Figure 11B:
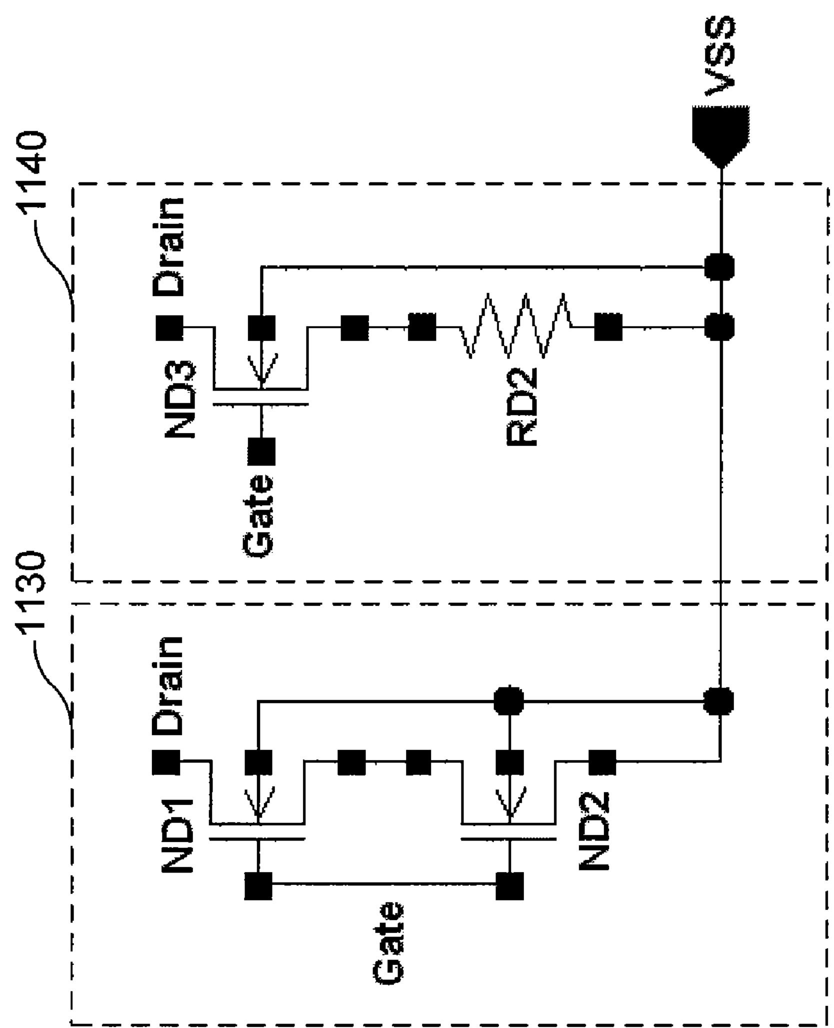

Referring to FIG. 11B, there is illustrated a third source degeneration circuit 1130 and a fourth source degeneration circuit 1140. Third source degeneration circuit 1130 includes an NMOS transistor ND1, with source degeneration achieved by a second NMOS transistor ND2. In third source degeneration circuit 1130, the source of ND1 is coupled to the drain of ND2 and the source of ND2 is coupled to a low voltage potential VSS. The gates of ND1 and ND2 are coupled together. Fourth source degeneration circuit 1140 includes a source degenerated NMOS transistor ND3, with source degeneration achieved by a resistor RD2. In fourth source degeneration circuit 1140, the source of ND3 is coupled to a first end of RD2 and a second end of RD2 is coupled to the low voltage potential VSS.

It is to be appreciated that the circuits depicted in FIGS. 11A and 11B are presented for illustrative purposes only. Other methods for improving the output impedance are possible as would be apparent to a person skilled in the relevant art(s).

In addition, the values of the various parameters presented above were included for illustrative purposes only. Other values of PMOS transistors P0, P1, P2, P0C, P1C, and P2C can be used without deviating from the spirit and scope of the present invention.

Also, other values of NMOS transistors N0, N1, N2, N0C, N1C, N2C, NN0, NN1 and NN1C can be used without deviating from the spirit and scope of the present invention.

As will be appreciated by selecting or programming characteristics of the output current of first circuit 200" and the output current of second circuit 600' (in isolation), the output current iout of bias generator 180 can be selected to have a specifically controlled temperature varying output current.

V. Example Software Implementation

In addition to hardware implementations of a bias generator in accordance with an embodiment of the present invention (e.g., bias generator 180 illustrated in FIG. 9), such bias generators may also be embodied in software disposed, for example, in a computer usable (e.g., readable) medium configured to store the software (e.g., a computer readable program code). The program code causes the enablement of embodiments of the present invention, including fabricating the systems and techniques disclosed herein (such as fabricating bias generator 180 and circuits included therein).

For example, this can be accomplished through the use of general programming languages (such as C or C++), hardware description languages (HDL) including Verilog, Verilog-A, HDL, VHDL, Altera HDL (AHDL) and so on, or other available programming and/or schematic capture tools (such as circuit capture tools). The program code can be disposed in any known computer usable medium including semiconductor, magnetic disk, optical disk (such as CD-ROM, DVD-ROM) and as a computer data signal embodied in a computer usable (e.g., readable) transmission medium (such as a carrier wave or any other medium including digital, optical, or analog-based medium). As such, the code can be transmitted over communication networks including the Internet and internets. It is understood that the functions accomplished and/or structure provided by the systems and techniques described above can be represented in a core (such as a CPU core and/or a GPU core) that is embodied in program code and may be transformed to hardware as part of the production of integrated circuits, or systems requiring substantially temperature invariant clock circuits (e.g., PLLs) such as computer systems, mobile devices, handsets, digital televisions and the like.

VI. CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A bias generator circuit, comprising:

a first circuit including a first input adapted to couple to a voltage source and a first output providing a first output current having a substantially non-zero temperature coefficient, the first circuit comprising a first transistor and a second transistor, wherein the first output current is based on a voltage difference between a gate-to-source voltage of the first transistor and a gate-to-source voltage of the second transistor; and a second circuit including a second input that receives the first output current from the first circuit and a second output that provides a second output current, the second circuit comprising a third transistor and a resistor, wherein the second output current is based on an addition of a gate-to-source voltage of the third transistor and a voltage across the resistor;

wherein the second output current has a substantially zero temperature coefficient.

2. The bias generator of claim 1, wherein the substantially zero temperature coefficient of the second output current is dependent on a difference between an effective channel size of the first transistor and an effective channel size of the second transistor.

3. The bias generator of claim 1, wherein the second circuit further comprises a fourth transistor, and wherein the substantially zero temperature coefficient of the second output current is dependent on a difference between an effective channel size of the third transistor and an effective channel size of the fourth transistor.

4. The bias generator of claim 3, wherein the substantially zero temperature coefficient of the second output current is also dependent on the first output current.

5. The bias generator of claim 2, wherein the effective channel size comprises at least one of an effective channel width and an effective channel length.

6. The bias generator of claim 1, wherein the first transistor, the second transistor, the third transistor, and a fourth transistor comprise field effect transistors.

7. The bias generator of claim 6, wherein the first circuit and the second circuit comprise complimentary metal-oxide semiconductor (CMOS) circuits.

8. The bias generator of claim 7, wherein:

the first circuit further comprises a coupling between a source of a fifth transistor and the voltage source, a coupling between a source of a sixth transistor and the voltage source, a coupling between a source of a seventh transistor and the voltage source, a coupling between a gate of the fifth transistor and a gate of the sixth transistor, a coupling between a gate of the fifth transistor and a gate of the seventh transistor, a coupling between a drain of the fifth transistor and a drain of the first transistor, a coupling between a source of the first transistor and a first end of a first resistor, a coupling between a second end of the first resistor and a ground potential, a coupling between a gate of the first transistor and a gate of the second transistor, a coupling between a source of the second transistor and the ground potential, and a coupling between a drain of the second transistor and the drain of the sixth transistor, a coupling between a drain of the seventh transistor and the first output; and the second circuit further comprises a coupling between a drain of the third transistor and the first output, a coupling between a source of the third transistor and a first end of a second resistor, a coupling between a second end of the second resistor and the ground potential, a coupling between a gate of the third transistor and a gate of the fourth transistor, a coupling between a source of the fourth transistor and the ground potential, and a coupling between a drain of the fourth transistor and the second output;

wherein the first, second, third, and fourth transistors are transistors of a first type, and the five, sixth, and seventh transistors are transistors of a second type.

9. A tangible computer readable storage medium containing instructions for generating an application-specific integrated circuit (ASIC), which if executed by a machine are adapted to create the ASIC, wherein the ASIC includes a bias generator comprising:

a first circuit including a first input adapted to couple to a voltage source and a first output that provides a first output current having a substantially non-zero temperature coefficient, the first circuit comprising a first transistor and a second transistor, wherein the first output current is based on a voltage difference between a gate-to-source voltage of the first transistor and a gate-to-source voltage of the second transistor; and a second circuit including a second input that receives the first output current from the first circuit and a second output that provides a second output current, the second circuit comprising a third transistor and a resistor, wherein the second output current is based on an addition of a gate-to-source voltage of the third transistor and a voltage across the resistor;

wherein the second output current has a substantially zero temperature coefficient.

10. The tangible computer readable storage medium of claim 9, wherein the substantially zero temperature coefficient of the second output current is dependent on a difference between an effective channel size of the first transistor and an effective channel size of the second transistor.

11. The tangible computer readable storage medium of claim 9, wherein the second circuit further comprises a fourth transistor, and wherein the substantially zero temperature coefficient of the second output current is dependent on a difference between an effective channel size of the third transistor and an effective channel size of the fourth transistor.

12. The tangible computer readable storage medium of claim 11, wherein the substantially zero temperature coefficient of the second output current is also dependent on the first output current.

13. The tangible computer readable storage medium of claim 10, wherein the effective channel size of the first transistor, the second transistor, the third transistor, and the fourth transistor comprises at least one of an effective channel width and an effective channel length.

14. The tangible computer readable storage medium of claim 9, wherein the first transistor, the second transistor, the third transistor, and a fourth transistor comprise field effect transistors.

15. The tangible computer readable storage medium of claim 14, wherein the first circuit and the second circuit comprise complimentary metal-oxide semiconductor (CMOS) circuits.

16. The tangible computer readable storage medium of claim 15, wherein:

the first circuit further comprises a coupling between a source of a fifth transistor and the voltage source, a coupling between a source of a sixth transistor and the voltage source, a coupling between a source of a seventh transistor and the voltage source, a coupling between a gate of the fifth transistor and a gate of the sixth transistor, a coupling between a gate of the fifth transistor and a gate of the seventh transistor, a coupling between a drain of the fifth transistor and a drain of the first transistor, a coupling between a source of the first transistor and a first end of a first resistor, a coupling between a second end of the first resistor and a ground potential, a coupling between a gate of the first transistor and a gate of the second transistor, a coupling between a source of the second transistor and the ground potential, and a coupling between a drain of the second transistor and the drain of the sixth transistor, a coupling between a drain of the seventh transistor and the first output; and the second circuit further comprises a coupling between a drain of the third transistor and the first output, a coupling between a source of the third transistor and a first end of a second resistor, a coupling between a second end of the second resistor and the ground potential, a coupling between a gate of the third transistor and a gate of the fourth transistor, a coupling between a source of the fourth transistor and the ground potential, and a coupling between a drain of the fourth transistor and the second output;

wherein the first, second, third, and fourth transistors are transistors of a first type, and the five, sixth, and seventh transistors are transistors of a second type.

17. The tangible computer readable storage medium of claim 9, wherein the instructions are embodied in a hardware description language.

18. A system including a substantially temperature invariant clock generator circuit, the system comprising:

a first circuit adapted to couple to a voltage source and output a temperature variant output current, the first circuit having a first temperature coefficient that is based on a voltage difference between a gate-to-source voltage of a first transistor and a gate-to-source voltage of a second transistor; and a second circuit that receives the temperature variant output current and outputs a substantially temperature invariant output current, the second circuit having a second temperature coefficient that is based on an addition of a gate-to-source voltage of a third transistor and a voltage across a resistor;

wherein the second temperature coefficient is substantially the additive inverse of the first temperature coefficient.

19. A method, comprising:

outputting, from a first circuit, a temperature variant output current upon receipt of a voltage, the first circuit having a first temperature coefficient that is based on a voltage difference between a gate-to-source voltage of a first transistor and a gate-to-source voltage of a second transistor; and receiving, at a second circuit, the temperature variant output current and outputting a substantially temperature invariant output current, the second circuit having a second temperature coefficient that is based on an addition of a gate-to-source voltage of a third transistor and a voltage across a resistor;

wherein the second temperature coefficient is substantially the additive inverse of the first temperature coefficient.

* * * * *